(12) United States Patent
Pavel et al.

(10) Patent No.: US 8,137,518 B2
(45) Date of Patent: Mar. 20, 2012

(54) MAGNETIC SHUNTS IN TUBULAR TARGETS

(75) Inventors: Hans-Joachim Pavel, Erlensee (DE); Josef Heindel, Hainburg (DE)

(73) Assignee: W.C. Heraeus GmbH, Hanau (DE)

( * ) Notice: Subject to any disclaimer, the term of this patent is extended or adjusted under 35 U.S.C. 154(b) by 563 days.

(21) Appl. No.: 12/277,808

(22) Filed: Nov. 25, 2008

(65) Prior Publication Data

US 2009/0139861 A1   Jun. 4, 2009

(30) Foreign Application Priority Data

Nov. 29, 2007 (DE) .................. 10 2007 057 870
Dec. 12, 2007 (DE) .................. 10 2007 060 306

(51) Int. Cl.
*C23C 14/00* (2006.01)

(52) U.S. Cl. .................. 204/298.13; 204/298.16

(58) Field of Classification Search ............. 204/298.13, 204/298.16, 298.21
See application file for complete search history.

(56) References Cited

U.S. PATENT DOCUMENTS

| | | |
|---|---|---|
| 5,653,856 A | 8/1997 | Ivanov et al. |
| 6,719,034 B2 | 4/2004 | Heck et al. |
| 2005/0034981 A1 | 2/2005 | Fuchs et al. |
| 2006/0151320 A1 | 7/2006 | Weigert et al. |
| 2009/0277777 A1* | 11/2009 | Schultheis et al. ......... 204/192.1 |

FOREIGN PATENT DOCUMENTS

| | | |
|---|---|---|
| DE | 3318828 C2 | 11/1984 |
| DE | 19622606 A1 | 12/1997 |
| DE | 10063383 C1 | 3/2002 |
| DE | 10336422 A1 | 3/2005 |
| DE | 20 2005 015 067 U1 | 2/2006 |
| DE | 102004058316 A1 | 6/2006 |
| EP | 1063679 A1 | 12/2000 |
| JP | 01147063 A | 6/1989 |
| JP | 2003138372 A | 5/2003 |

* cited by examiner

*Primary Examiner* — Stephen Rosasco

(74) *Attorney, Agent, or Firm* — Panitch Schwarze Belisario & Nadel LLP

(57) ABSTRACT

A sputter target has a carrier body and a target material arranged on the carrier body, wherein the carrier body has a rear surface facing away from the target material and the target material has a front surface facing away from the carrier body. A ferromagnetic material is arranged between the front surface and the rear surface.

8 Claims, 2 Drawing Sheets

MAGNETIC SHUNTS IN TUBULAR TARGETS

BACKGROUND OF THE INVENTION

The invention relates to a sputter target comprising a carrier body and a target material arranged on the carrier body, wherein the carrier body has a rear surface facing away from the target material and the target material has a front surface facing away from the carrier body.

Sputter targets often have the disadvantage that the material is sputtered non-uniformly, so that the material to be sputtered has already been consumed at some positions of the sputter target, while sufficient sputter material is still present at other positions. Therefore, the originally present sputter material is often not utilized optimally. In practice, it is often attempted to achieve a more uniform abrasion through a readjustment of the magnetic systems in the sputtering installations or through the application of additional magnetic systems, in order to achieve higher sputtering rates. Such systems are described, for example, in German published patent application DE 103 36 422 A1. European patent application publication EP 1 063 679 A1 takes a different approach. Here, sheet-metal strips are integrated into the magnetic system underneath the sputter target. Similar approaches are described in German published patent application DE 196 22 606 A1.

Japanese patent application publication JP 2003138372 A describes another approach for increasing the sputtering rates. Here, the thickness of the sputter material is varied across the surface area of the sputter target. A reduced thickness of the sputter material allows the penetration of the magnetic field through the magnetic sputter material. Additional planar sputter targets are known from Japanese patent application publication JP 1147063 A. Here, magnetic strips are embedded in the base plate of the sputter target, so that ring-shaped abrasion patterns are generated, whereby concentric peaks and valleys alternate for the shown, wedge-shaped target plates.

BRIEF SUMMARY OF THE INVENTION

An object of the present invention is to provide sputter targets, in particular tubular targets, that exhibit an abrasion behavior as uniform as possible. For this purpose, the magnetic field in the sputtering process should be influenced in a very simple way.

Because a ferromagnetic material is arranged between the front surface of the target material and the rear surface of the carrier body, the available system-specific magnetic field is influenced thereby, such that the service life of the sputter target is increased by reducing the sputtering trenches that are possibly formed. In particular, advantages arise during sputtering when the carrier body is formed as a carrier tube and the target material is arranged on the outside of the carrier tube. Here, it has been shown, surprisingly, that it is possible to improve the abrasion behavior without negatively affecting the tubular construction itself, even for a tubular structure that is relatively complicated to produce.

The ferromagnetic material can be arranged beneficially in or at an intermediate space between the carrier body and the target material. It can be located outside of the center of the longitudinal extent, particularly in the direction of the greatest longitudinal extent, of the carrier body, so that the ends of the tubes or the sputtering regions lying in the region of the ends of the tubes are affected. An especially advantageous and uniform abrasion results when the ferromagnetic material has an edge-less profile in a longitudinal section along the greatest extent of the carrier body above the base line of the ferromagnetic material. With such a construction of the ferromagnetic material, its thickness changes continuously and steadily, so that the magnetic field is likewise changed steadily and, as a result, a uniform abrasion takes place viewed across the surface of the sputter material.

The ferromagnetic material can, in particular, be sprayed on. For this purpose, among other things, plasma spraying lends itself. The use of ferromagnetic material is particularly advantageous in such cases in which the target material itself is not ferromagnetic. The ferromagnetic material can be embedded in the carrier body and/or in the target material. In particular, the carrier material can also be influenced to the extent that it has ferromagnetic properties. Generally, a carrier tube is formed, for example, of stainless steel. It is possible to subject such a carrier tube to a heat treatment up to phase transformation. For this purpose, temperatures of >900° C. are necessary. The heating is followed by a rapid cooling, so that the resulting phase state is practically frozen in, so that the carrier tube is formed of a ferromagnetic stainless steel. It is likewise possible to generate defined ferromagnetic regions in a carrier tube made of stainless steel, in which, for example, the material of the carrier body, particularly the carrier tube, is partially fused, for example by a welding process, so that partially ferromagnetic areas are created.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
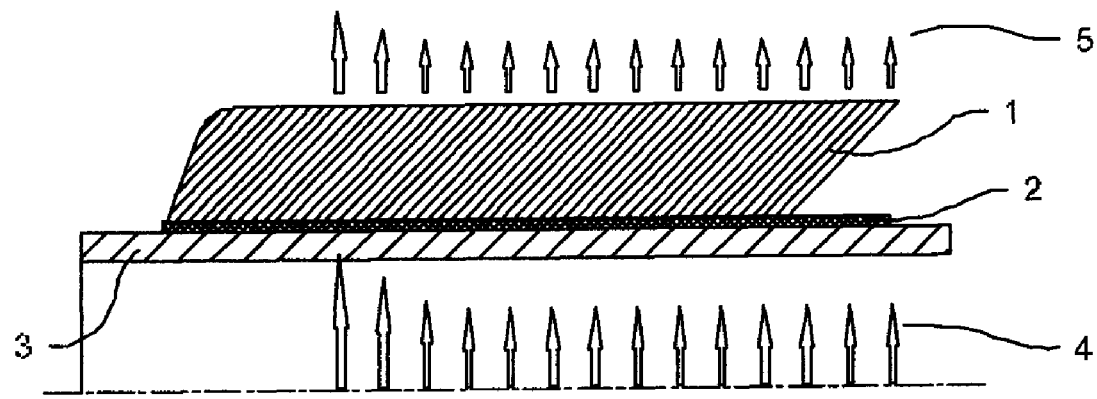
FIG. 1a is a side sectional view through a conventional sputter target before sputtering.
Figure 1B:
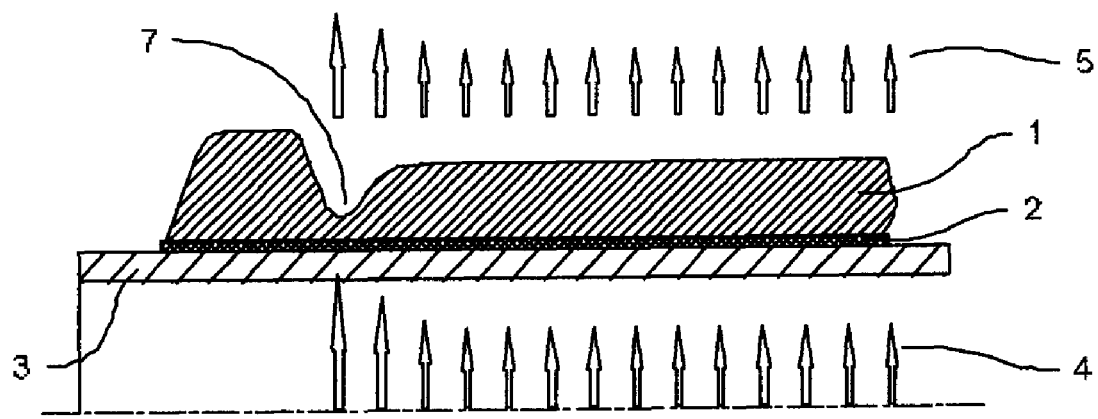
FIG. 1b is a side sectional view through a conventional sputter target after sputtering.

In FIG. 1a, a portion of a tubular sputter target is shown having a target material 1 deposited on a carrier tube 3. Between the target material 1 and the carrier tube 3 an adhesive layer 2 is arranged, e.g. a solder layer, which fixes the target material 1 onto the carrier tube 3 and binds the two to each other in an electrical and heat-conductive manner. The magnetic field lines 4 acting from the interior of the carrier tube 3 are adjusted in their strength along the sputter target corresponding to the intended abrasion of the target material 1. These magnetic field lines are attenuated by the target material 1, the adhesive layer 2, and the carrier tube 3, so that the resulting magnetic field 5 exhibits a lower strength. Due to the varying strengths of the magnetic field lines 4, a varying sputtering abrasion of the target material 1 is produced, so that, as shown in FIG. 1b, so-called sputter trenches 7 can arise. Therefore, the sputter target must be exchanged long before the theoretical material to be sputtered is consumed.

Figure 2:
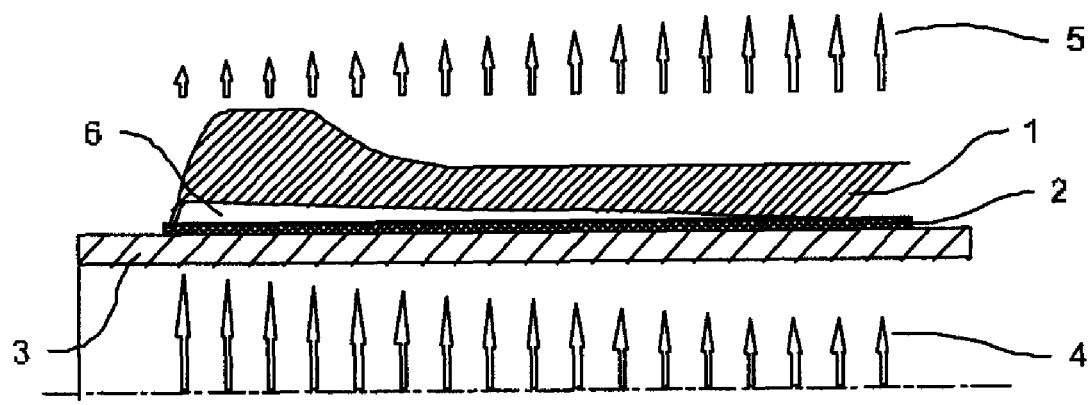
FIG. 2 is a side sectional view through a sputter target according to an embodiment of the present invention.

In FIG. 2, a sputter target according to an embodiment of the present invention is shown after the sputtering process. Here, a ferromagnetic material 6 has been introduced between the target material 1 and the carrier tube 3. This ferromagnetic material has led to a more uniform material abrasion. In the end region of the target material 1, where generally less abrasion is desired, the ferromagnetic material 6 is formed thicker, so that the magnetic field penetration is hindered. By the continuous formation of the ferromagnetic material 6, a uniform abrasion has been achieved. The ferromagnetic material 6 was sprayed on.

As the ferromagnetic material, nickel can be used, for example, wherein the layer thickness, the density of the material of the layer, and the formation of the layer (magnetic orientation) can be adapted for the intended result, whereby it should be ensured that a minimum magnetic field penetration remains. The optimum layer thickness is influenced by the ferromagnetic material 6 itself, by the formation of the layer, and by the density of the layer. The layer thickness has, according to the intended result, a value up to 2.5 mm.

The ferromagnetic material 6 is embedded between the carrier tube 3 and the target material 1. It has been sprayed on. By "embedding" the ferromagnetic material 6, cross-contamination is avoided during the sputtering process, so that the object to be coated is coated only with the target material 1 itself. The ferromagnetic material 6 can also be arranged as an inner coating of the target material 1 (on the inside of the tube made from target material 1) or within the target material 1. Therefore, it is also effective when so-called monolithic sputter targets are used, that is, sputter targets in which the target material simultaneously represents the carrier tube.

As an alternative to a sprayed-on ferromagnetic material 6, it is also possible to apply foils or rings onto the carrier tube 3, preferably by soldering or welding. Ferromagnetically active layers can also be worked into the target material 1 itself, particularly on its underside. A welding of magnetically active carrier tube segments is also possible, so that the carrier tube 3 is made of several segments. Some of these segments are ferromagnetic, so that local changes in the magnetic material properties of the carrier tube are realized. The ferromagnetically active material 6 itself can be nickel, iron, or cobalt, for example.

The carrier tube 3 generally has a thickness of 3 to 6 mm, wherein a standard thickness lies at 4 mm. The invention can be used with carrier tubes 3 made from practically any suitable material. To be identified here are, for example, stainless steel, copper, aluminum, or titanium, optionally with the inclusion of ferromagnetic segments. The thickness of the target material 1 lies, for example, in the range of 2 to 20 mm. A limit to the thickness is given by the magnetic field penetration of the magnetic sets used in the sputtering installation, by the production process, and by the material costs.

By influencing the magnetic field in the sputter target, an expensive adjustment of the sputtering installation or the magnets on the sputtering installation can be avoided, while simultaneously increasing the material yield of the target material 1.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A sputter target comprising a carrier body, a non-ferromagnetic target material arranged on the carrier body, the carrier body having a rear surface facing away from the target material and the target material having a front surface facing away from the carrier body, and a ferromagnetic material arranged between the front surface and the rear surface, wherein the ferromagnetic material has a thickness that changes continuously and steadily along the greatest length of the carrier body.

2. The sputter target according to claim 1, wherein the carrier body has a form of a carrier tube and the target material is arranged on an outer side of the carrier tube.

3. The sputter target according to claim 1, wherein the ferromagnetic material is arranged in or on an intermediate space between the carrier body and the target material.

4. The sputter target according to claim 1, wherein the ferromagnetic material is arranged outside of a center of a longitudinal extent in a direction of a greatest longitudinal extent of the carrier body.

5. The sputter target according to claim 1, wherein the ferromagnetic material has an edge-less profile in a longitudinal section along a greatest extent of the carrier body above a base line of the ferromagnetic material.

6. The sputter target according to claim 1, wherein the ferromagnetic material is sprayed on.

7. The sputter target according to claim 1, wherein the ferromagnetic material is embedded in the carrier body and/or the target material.

8. The sputter target according to claim 1, wherein the carrier body is formed from a ferromagnetic stainless steel.

* * * * *